United States Patent
Chakkirala et al.

(10) Patent No.: US 12,363,475 B2
(45) Date of Patent: Jul. 15, 2025

(54) ADAPTIVELY ADJUSTING AN INPUT CURRENT LIMIT FOR A BOOST CONVERTER

(71) Applicant: QUALCOMM Incorporated, San Diego, CA (US)

(72) Inventors: Subbarao Surendra Chakkirala, San Jose, CA (US); Sherif Galal, Irvine, CA (US); Earl Schreyer, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 87 days.

(21) Appl. No.: 17/699,902

(22) Filed: Mar. 21, 2022

(65) Prior Publication Data

US 2023/0300524 A1 Sep. 21, 2023

(51) Int. Cl.
*H02M 1/14* (2006.01)
*H02M 3/156* (2006.01)
*H04R 3/00* (2006.01)

(52) U.S. Cl.
CPC ............... *H04R 3/00* (2013.01); *H02M 1/14* (2013.01); *H02M 3/156* (2013.01)

(58) Field of Classification Search
CPC ..... G05F 1/00; G05F 1/10; G05F 1/12; G05F 1/46; G05F 1/455; G05F 1/45; G05F 1/445; G05F 1/66; G05F 1/40; G05F 1/42; G05F 1/44; G05F 1/462; G05F 1/52; G05F 1/56; G05F 3/10; G05F 3/16; G05F 3/18;

(Continued)

(56) References Cited

U.S. PATENT DOCUMENTS 7,317,625 B2 * 1/2008 Zhang ................. H02M 1/4225
                                                              323/222
7,855,539 B1   12/2010 Wong et al.
(Continued)

FOREIGN PATENT DOCUMENTS

EP      3147900 A1    3/2017
JP    2021197750 A   12/2021

OTHER PUBLICATIONS

Co-pending U.S. Appl. No. 17/145,831, inventor Chakkirala; Bubbarao, filed Jan. 11, 2021.

(Continued)

*Primary Examiner* — Jeffrey A Gblende
(74) *Attorney, Agent, or Firm* — Patterson + Sheridan, L.L.P.

(57) ABSTRACT

Apparatus and techniques for adaptively adjusting an input current limit for a boost converter supplying power to a load, such as an amplifier. An example circuit for supplying power generally includes a boost converter having an output coupled to a load, and logic configured to adaptively adjust an input current limit for the boost converter based on an estimated output power for the boost converter and to apply the input current limit to the boost converter. One example method for supplying power generally includes converting an input voltage to an output voltage with a boost converter, to power a load for the boost converter, adaptively adjusting an input current limit for the boost converter based on an estimated output power for the boost converter, and applying the input current limit to the boost converter during the converting.

26 Claims, 9 Drawing Sheets

(58) Field of Classification Search
CPC ... G05F 3/185; G05F 3/20; G05F 3/26; G05F 3/30; G05F 3/205; G05F 3/22; G05F 3/24; G05F 3/222; G05F 3/242; G05F 3/225; G05F 3/227; G05F 3/245; G05F 3/247; G05F 3/262; G05F 3/265; G05F 3/267; G05F 1/575; H02M 5/2573; H02M 1/081; H02M 5/293; H02M 7/12; H02M 3/10; H02M 3/125; H02M 3/13; H02M 3/135; H02M 3/145; H02M 3/15; H02M 3/155; H02M 3/156; H02M 3/157; H02M 3/158; H02M 1/346; H02M 3/1588; H02M 2003/1566; H02M 3/1582; H02M 3/1584; H02M 2003/1557; H02M 1/0032; H02M 1/4225; H02M 7/217; H02M 1/0025; H02M 1/0045; H05B 39/048; B23K 11/24; H04B 2215/069
See application file for complete search history.

(56) References Cited

U.S. PATENT DOCUMENTS

| | | | |
|---|---|---|---|
| 8,659,282 B2* | 2/2014 | Chen | H02M 3/156 323/283 |
| 8,928,299 B2 | 1/2015 | Matzberger et al. | |
| 8,929,299 B2* | 1/2015 | Matsumoto | G06Q 40/00 455/566 |
| 9,154,029 B2* | 10/2015 | Wang | H02M 3/155 |
| 9,178,364 B1 | 11/2015 | Khlat et al. | |
| 9,525,344 B2* | 12/2016 | Chen | H02M 3/156 |
| 9,740,218 B2 | 8/2017 | Dagan et al. | |
| 10,063,251 B2 | 8/2018 | Hsiao et al. | |
| 10,389,243 B2 | 8/2019 | Chakkirala | |
| 10,686,414 B2 | 6/2020 | Wen et al. | |
| 10,917,050 B2* | 2/2021 | Hogan | H02M 3/158 |
| 11,011,987 B2 | 5/2021 | Kanjavalappil Raveendranath et al. | |
| 11,239,752 B2 | 2/2022 | May et al. | |
| 11,381,185 B2* | 7/2022 | Oonishi | H02M 3/1582 |
| 2004/0135635 A1 | 7/2004 | Noro | |
| 2013/0287216 A1 | 10/2013 | Eriksson et al. | |
| 2015/0157240 A1 | 6/2015 | Shoudy et al. | |
| 2015/0340947 A1* | 11/2015 | Deboy | H02M 3/155 307/82 |
| 2018/0075862 A1 | 3/2018 | Shi et al. | |
| 2021/0234457 A1 | 7/2021 | Silva et al. | |
| 2021/0399630 A1 | 12/2021 | D'Amore et al. | |

OTHER PUBLICATIONS

International Search Report and Written Opinion—PCT/US2023/063061—ISA/EPO—May 31, 2023.

Schaef C., et al., "A Fully Integrated Voltage Regulator in 14nm CMOS with Package-Embedded Air-Core Inductor Featuring Self-Trimmed, Digitally Controlled Variable On-Time Discontinuous Conduction Mode Operation", IEEE International Solid-State Circuits Conference, ISSCC, Session 8 / DC-DC Converters / 8.5, 2019, 3 Pages.

Texas Instruments: "TPS61252 Tiny 1.5-A Boost Converter With Adjustable Input Current Limit", SLVSAG3A—Sep. 2010-Revised Dec. 2014, 27 Pages.

* cited by examiner

ADAPTIVELY ADJUSTING AN INPUT CURRENT LIMIT FOR A BOOST CONVERTER

TECHNICAL FIELD

Certain aspects of the present disclosure generally relate to electronic circuits and, more particularly, to a power supply circuit including a boost converter.

BACKGROUND

A speaker is a transducer that produces a pressure wave in response to an input electrical signal, and thus, sound is generated. The speaker input signal may be produced by an audio amplifier (also referred to as a "power amplifier") that receives a relatively lower voltage analog audio signal and generates an amplified signal (with a relatively higher voltage) to drive the speaker. A dynamic loudspeaker is typically composed of a lightweight diaphragm (a cone) connected to a rigid basket (a frame) via a flexible suspension (often referred to as a "spider") that constrains a voice coil to move axially through a cylindrical magnetic gap. When the input electrical signal is applied to the voice coil, a magnetic field is created by the electric current in the coil, thereby forming a linear electric motor. By varying the electrical signal from the audio amplifier, the mechanical force generated by the interaction between the magnet and the voice coil is modulated and causes the cone to move back and forth, thereby creating the pressure waves interpreted as sound.

An amplifier (such as an audio amplifier) may be powered by a voltage regulator, such as a boost converter. A boost converter is a type of switched-mode power supply (SMPS) for stepping up voltage (and stepping down current) from the input to the output. A boost converter may be used to step up an input voltage (e.g., from a battery) to generate a greater output voltage which may be supplied to a device, such as an amplifier. A boost converter typically includes: (1) an inductor coupled between an input supply node and a switching node, (2) a switch coupled between the switching node and a reference potential node, (3) and another switch (or a diode) coupled between the switching node and a load (e.g., represented by a shunt capacitive element). The switches are typically implemented with power transistors.

A voltage regulator (e.g., a boost converter) may be controlled by (or at least a portion thereof may be included in) a power management integrated circuit (power management IC or PMIC). A PMIC may be used for managing the power requirement of a host system and may be used in battery-operated devices, such as mobile phones, tablets, laptops, wearables, etc., to control the flow and direction of electrical power in the devices. The PMIC may perform a variety of functions for the device such as DC-to-DC conversion (e.g., using a voltage regulator as described above), battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to apparatus and techniques for adaptively adjusting an input current limit for a boost converter.

Certain aspects of the present disclosure are directed to a method of supplying power. The method generally includes converting an input voltage to an output voltage with a boost converter, to power a load for the boost converter, adaptively adjusting an input current limit for the boost converter based on an estimated output power for the boost converter, and applying the input current limit to the boost converter during the converting.

Certain aspects of the present disclosure are directed to a circuit for supplying power to a load. The circuit generally includes logic and a boost converter having an output coupled to the load. The logic is generally configured to adaptively adjust an input current limit for the boost converter based on an estimated output power for the boost converter and apply the input current limit to the boost converter.

Certain aspects of the present disclosure are directed to an apparatus for supplying power. The apparatus generally includes means for converting an input voltage to an output voltage, to power a load for the means for converting, wherein the output voltage is greater than the input voltage; means for adaptively adjusting an input current limit for the means for converting, based on an estimated output power for the means for converting; and means for applying the input current limit to the means for converting.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide circuitry and techniques for dynamically adjusting an input current limit for a boost converter. Such circuitry and techniques may reduce power loss, thereby improving the efficiency of the boost converter.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Device and Audio System

Figure 1:
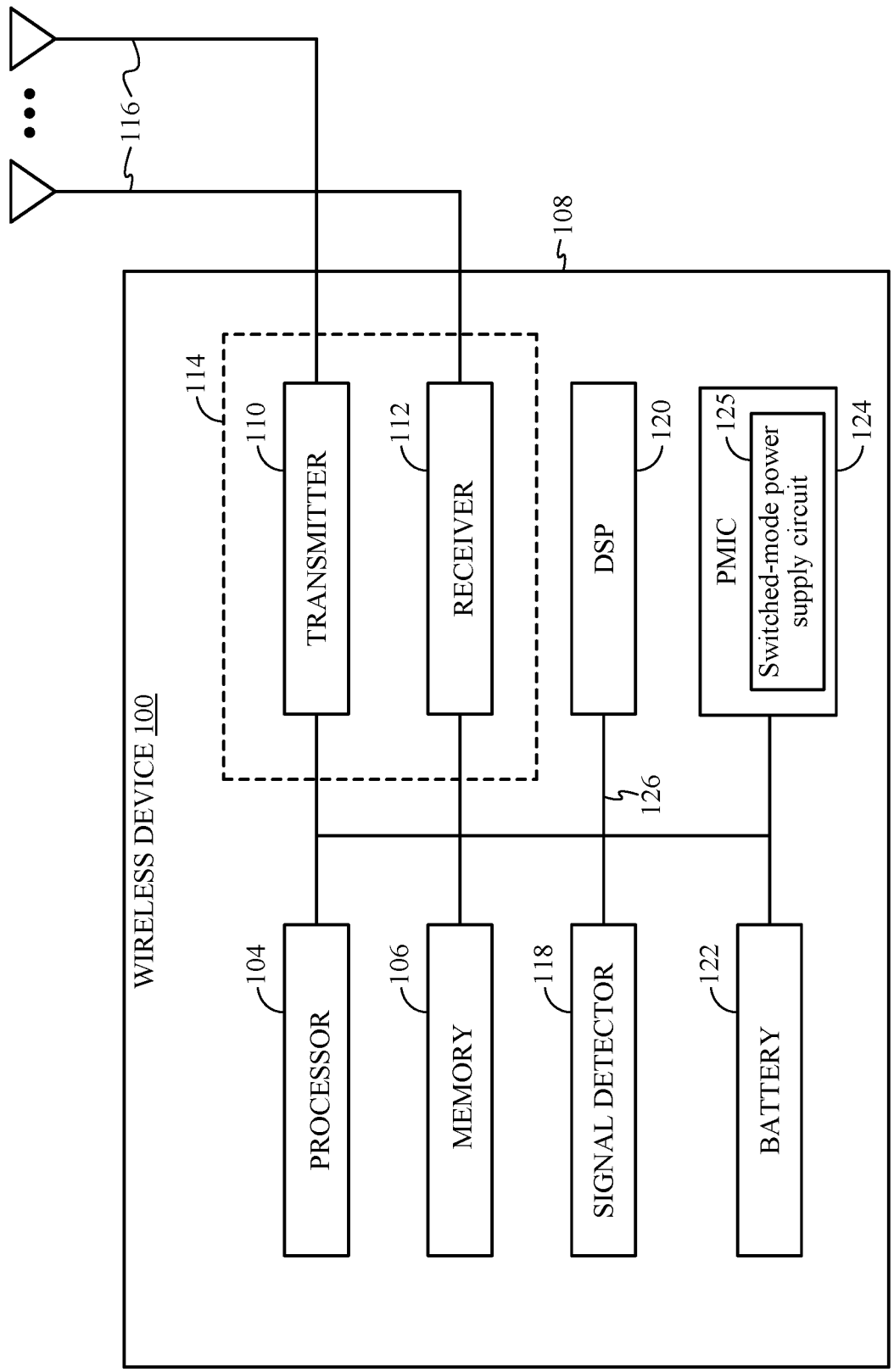
FIG. 1 illustrates a block diagram of an example device that includes a switched-mode power supply (SMPS) circuit, in which aspects of the present disclosure may be implemented.

FIG. 1 illustrates an example device 100 in which aspects of the present disclosure may be implemented. The device 100 may be a battery-operated device such as a cellular phone, a personal digital assistant (PDA), a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include at least a portion of a power supply circuit, which may include a switched-mode power supply circuit 125. The switched-mode power supply circuit 125 may be implemented by any of various suitable switched-mode power supply circuit topologies, such as a boost converter. For certain aspects, the power supply circuit may include a boost converter circuit with a feedback control circuit, as described below. Among other functions, the feedback control circuit may be used to adaptively adjust an input current limit for the boost converter circuit, as described below.

The device 100 may additionally include one or more speakers (not shown) for transducing electrical signals into audio signals. In this case, the device 100 may include one or more amplifiers for driving the speaker(s), and these amplifiers may be powered by one or more power supply circuits, which may be part of the PMIC or receive power supply voltage rails generated by the PMIC.

The various components of the device 100 may be coupled together by a bus system 126, which may include a power bus, a control signal bus, and/or a status signal bus in addition to a data bus.

Figure 2:
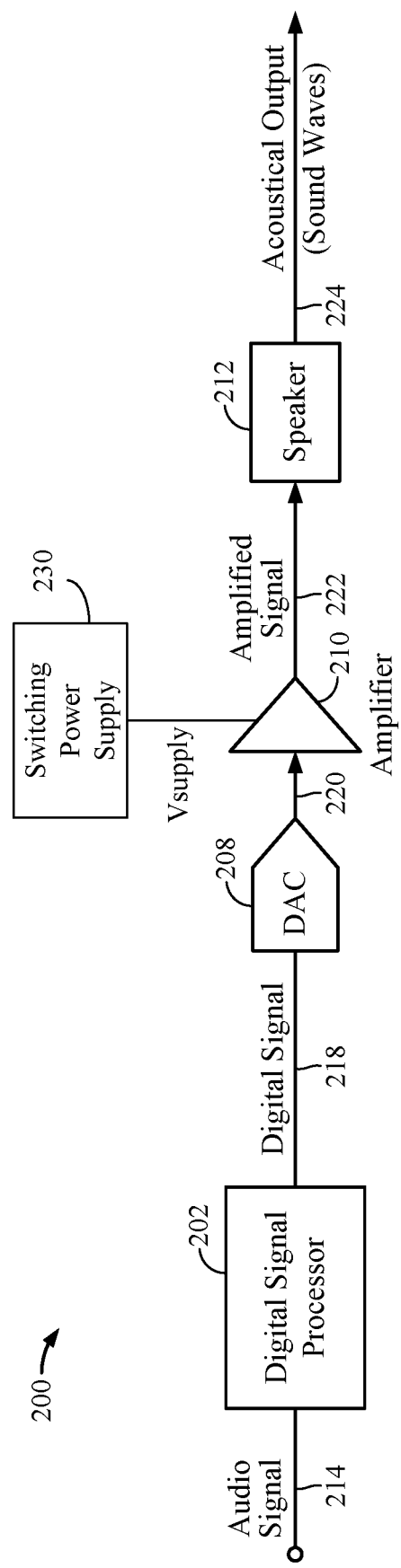
FIG. 2 is a block diagram of an example audio system, in which aspects of the present disclosure may be implemented.

FIG. 2 is a block diagram of an example audio system 200, in which aspects of the present disclosure may be implemented. The audio system 200 may be incorporated in any of various suitable devices, such as the device 100. As illustrated, a digital signal processor (DSP) 202 may receive and process audio signals 214 (e.g., a digital audio signal), for example, by applying a digital filter aimed at increasing audio quality and/or adjusting certain audio properties. The processed digital signal 218 produced by the DSP (or a further processed version thereof) may be converted to an analog signal 220 using a digital-to-analog converter (DAC) 208. In certain aspects, the DAC 208 may be implemented as part of the DSP 202. The analog signal 220 may be amplified using an amplifier 210 to generate an amplified signal 222. For example, the amplifier 210 may be a switching amplifier, such as a class-D amplifier. The amplified signal 222 may drive a speaker 212 to produce an acoustic output 224 (e.g., sound waves). A power supply voltage ($V_{supply}$) for the amplifier 210 may be generated by a switching power supply 230 (e.g., the switched-mode power supply circuit 125).

As described herein, the switching power supply 230 may include a boost converter and logic configured to adaptively adjust an input current limit for the boost converter.

Example Boost Converter Circuit with Feedback Control

Figure 3A:
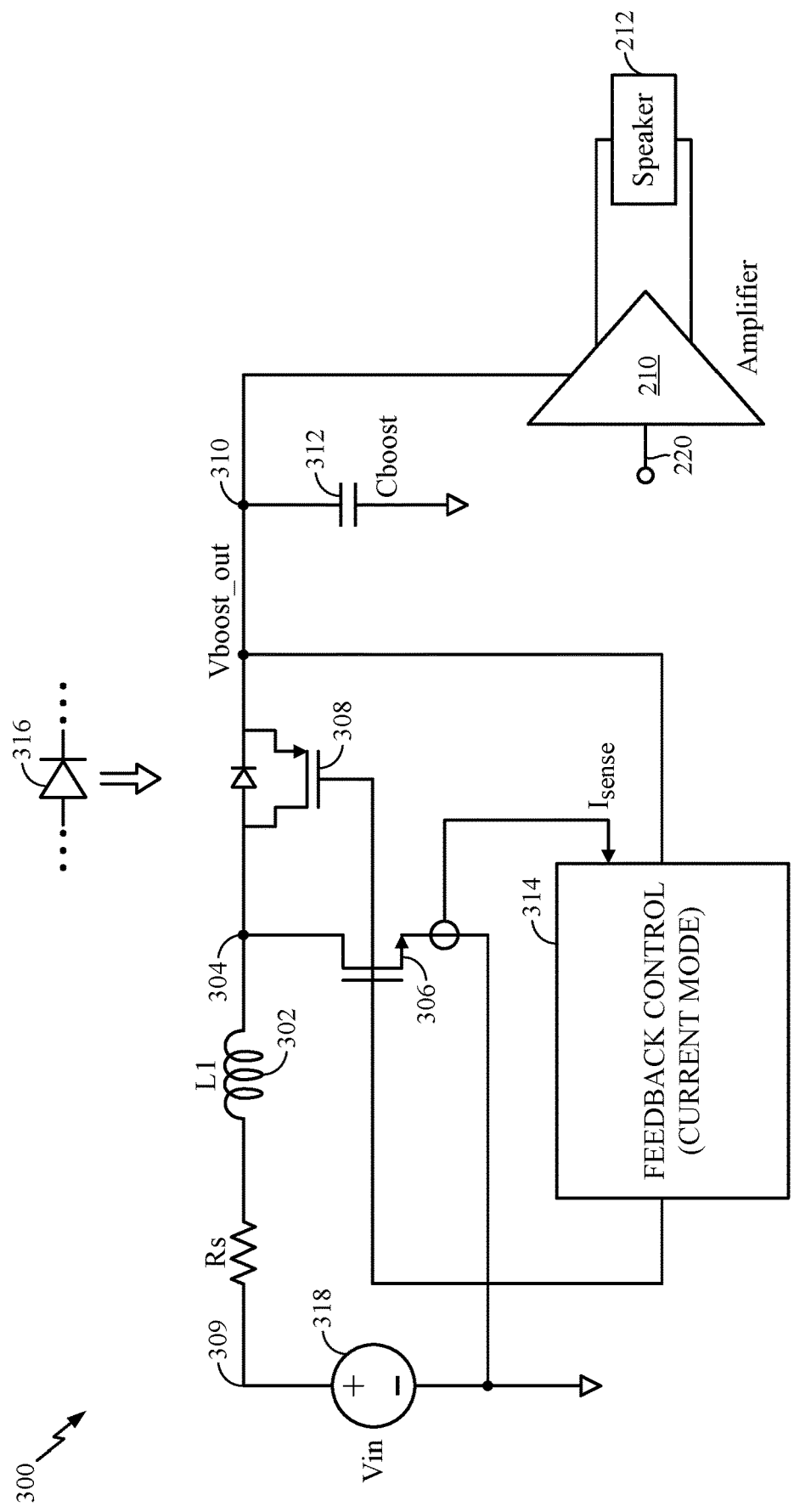
FIG. 3A is a block diagram of an example power supply circuit comprising a boost converter and a feedback control circuit, in which aspects of the present disclosure may be implemented.

FIG. 3A illustrates an example power supply circuit 300 (also referred to herein as a "boost converter circuit"), in which aspects of the present disclosure may be implemented. The power supply circuit 300 is implemented with a boost converter, which includes an inductive element 302 (e.g., inductor L1) and a switch 306, both coupled to a node 304 (also referred to as the "switching node"). The power supply circuit 300 also includes a switch 308 coupled between the node 304 and an output node 310 of the boost converter. Switch 306 and/or switch 308 may each be implemented by one or more transistors, which may be n-type field-effect transistors (NFETs) or p-type field-effect transistors (PFETs), as illustrated in FIG. 3A. For example, although switch 308 is depicted in FIG. 3A as being implemented by a PFET, the reader is to understand that switch 308 may be implemented as an NFET in other aspects, in which case the gate drive polarity may be reversed. The output node 310 may be coupled to an energy storage device (e.g., a capacitive element 312, such as capacitor $C_{boost}$) and a load, which is represented in FIG. 3A by an amplifier (e.g., the amplifier 210) and is represented in FIG. 3B by a resistor $R_{load}$.

Switch 306 may be controlled by a pulse-width modulation (PWM) signal to open and close switch 306 in an effort to regulate a voltage across the capacitive element 312 (i.e., the voltage $V_{boost\_out}$ at the output node 310). For example, during a first period, switch 306 may be closed, transferring energy from an input voltage source 318 (having voltage $V_{in}$ at input node 309 and series resistance $R_s$) and storing the energy in the inductive element 302. Switch 306 may be opened during a second period, transferring the energy stored in the inductive element 302 through switch 308 to the capacitive element 312. In certain aspects, switch 308 may be replaced with a diode 316, and the energy stored in the inductive element 302 may be transferred to the capacitive element 312 via the diode 316.

As illustrated, the power supply circuit 300 also includes a current-mode feedback control circuit 314, having an input coupled to the output node 310 and having an output coupled to the control input of the switch 306 (and in some cases, to the control input of the switch 308). The feedback control circuit 314 may control the switch 306 and also, in some cases, the switch 308 based on both the voltage $V_{boost\_out}$ at the output node 310 and a current through the switch 306. For example, the feedback control circuit 314 may receive a current sense signal $I_{sense}$ that is representative of the current through the switch 306. $I_{sense}$ also represents the current through the inductive element 302 during the first period when the switch 306 is closed. However, in some cases, the feedback control circuit 314 may directly sense the current through the inductive element 302. Based on $I_{sense}$ and $V_{boost\_out}$, the feedback control circuit 314 may control the current through the inductive element 302 by controlling the duty cycle of the PWM signal used to drive the switch 306 (and the switch 308).

Figure 3B:
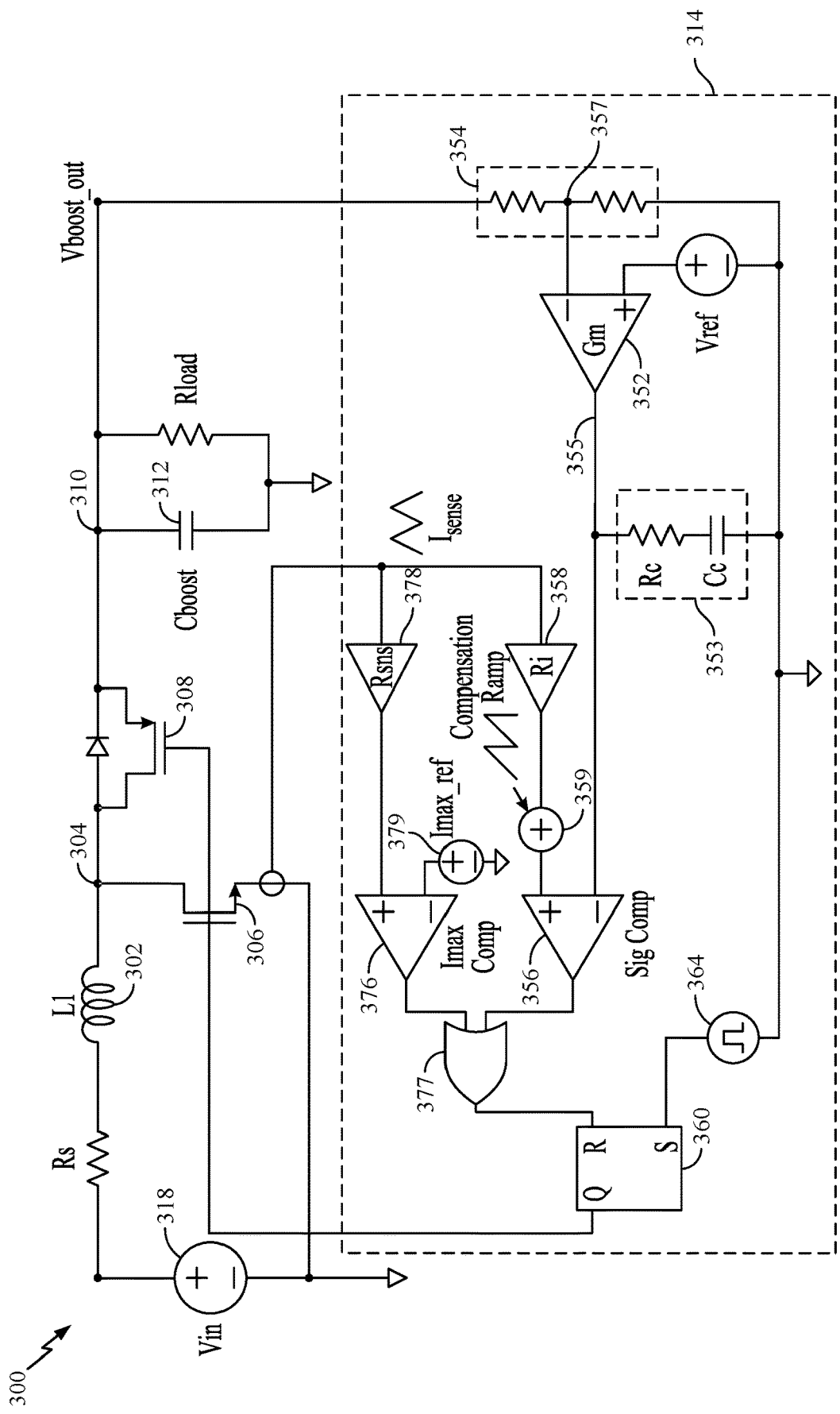
FIG. 3B illustrates an example implementation of the feedback control circuit of FIG. 3A, in which aspects of the present disclosure may be implemented.

FIG. 3B illustrates an example implementation of the feedback control circuit 314 of FIG. 3A, in accordance with certain aspects of the present disclosure. As illustrated, the feedback control circuit 314 includes an amplifier 352 (e.g., a transconductance (Gm) amplifier) having a negative input coupled to a tap 357 of a voltage divider 354. The voltage divider 354 is used to scale down the voltage $V_{boost\_out}$. Thus, the amplifier 352 may compare the scaled-down voltage at the tap 357 to a reference voltage source (labeled "$V_{ref}$" and coupled to a positive input of the amplifier) and generate an output current. The output of the amplifier 352 may be coupled to an impedance 353, which may be used to convert the output current of the amplifier 352 to a voltage. In certain aspects, the impedance 353 may be implemented using a resistor $R_c$ connected in series with a capacitor $C_c$, as illustrated in FIG. 3B.

The output of the amplifier 352 may provide an output voltage at node 355, which may influence the duty cycle of the boost converter. The feedback control circuit 314 may also include a comparator 356 (e.g., a signal comparator) with an input coupled to the output of the amplifier 352. Another input of the comparator 356 may be configured to receive a signal representative of $I_{sense}$ for comparison to the voltage at the output of the amplifier 352. For example, the current $I_{sense}$ may be converted to a current sense voltage via a current-sensing circuit 358 (e.g., which may include a current-to-voltage converter, labeled "$R_i$"). In certain aspects, a compensation ramp signal may be combined with (e.g., added to) the current sense voltage for slope compensation and to stabilize the current loop feedback.

For certain aspects, the feedback control circuit 314 includes a comparator 376 (e.g., a maximum current ($I_{max}$) comparator) and a voltage source 379 configured to produce a maximum current reference voltage ($I_{max\_ref}$) (i.e., a reference voltage representative of a maximum input current for the boost converter). The comparator 376 may be configured to receive a signal representative of $I_{sense}$ for comparison to the maximum current reference voltage. For example, the current $I_{sense}$ may be converted to a current sense voltage via a current-sensing circuit 378 (e.g., which may include a current-to-voltage converter, labeled "$R_{sns}$"). In this manner, the comparator 376 may effectively output a logical high signal if the sensed current ($I_{sense}$) is greater than a threshold current (e.g., the maximum input current, also referred to as the "input current limit").

In certain aspects, the feedback control circuit 314 also includes a flip-flop 360 (e.g., a set-reset (SR) flip-flop) for outputting the PWM signal at output Q to control the switch 306 (and the switch 308). For example, the set (S) input of the flip-flop 360 may be coupled to an output of a pulse generator 364, and the reset (R) input of the flip-flop 360 may be coupled to the output of a logical OR gate 377, having inputs coupled to the outputs of the comparator 356 and the comparator 376. The pulse generator 364 may generate a pulse signal for driving the S input of the flip-flop 360. The pulse signal may have a periodic waveform with about a 1 to 2% duty cycle, for example. In this manner, the duty cycle of the PWM signal output by the flip-flop 360 is controlled based on $I_{sense}$ and $V_{boost\_out}$.

Example Boost Converter Circuit with Dynamic Input Current Limit Control

A boost converter (e.g., such as the boost converter of FIGS. 3A and 3B) may be configured to convert an input voltage (e.g., from a battery of a portable device) to an output voltage by pulling input current from an input voltage source to produce the desired output power. In some cases, this input current may be limited to a constant value (e.g., based on $I_{max\_ref}$) dictated by a maximum current allowed from the input source (e.g., the battery) for a particular application. That is, the input current limit may be set based on a peak output power. The input current of the boost converter may be clamped to the input current limit whenever the boost converter tries to exceed the input current limit. It may be possible to increase efficiency of the boost converter if the output voltage can be allowed to droop a little, but still provide sufficient headroom for the load.

Certain aspects of the present disclosure provide techniques and apparatus for adaptively adjusting an input current limit for the boost converter based on an estimated power for the boost converter (e.g., an average predicted output power). For certain aspects, the input current limit may be based on frequency of an input signal to a load being powered by the boost converter. The input current limit may be determined before an input signal peak occurs (and held). Adaptively adjusting the input current limit based on the estimated power may reduce the conduction loss in the boost converter (e.g., through the switches 306 and/or 308), thereby improving the efficiency of the boost converter.

Figure 4A:
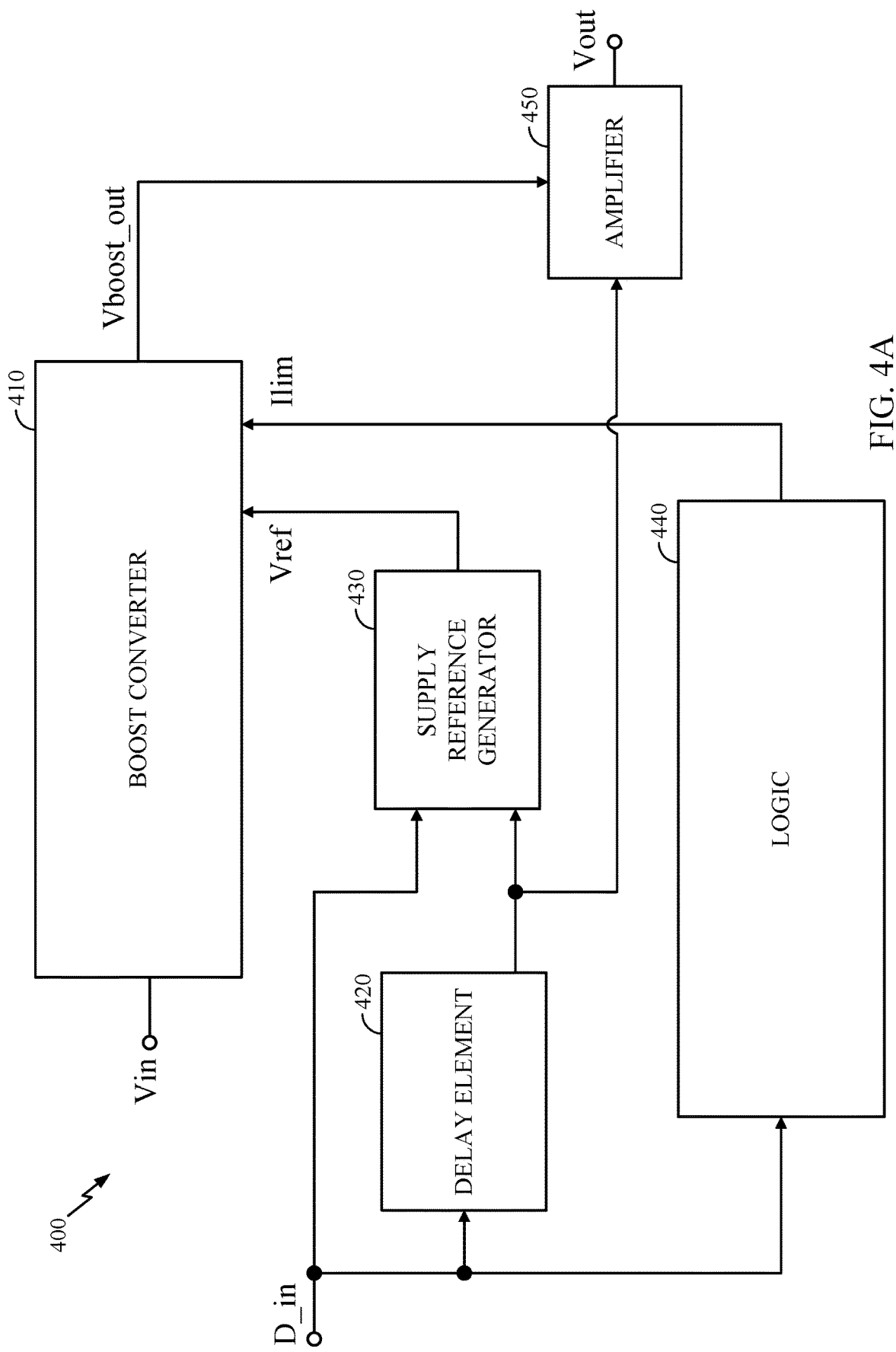
FIG. 4A is a block diagram of an example power supply circuit including a boost converter and capable of adaptively adjusting an input current limit for the boost converter, in accordance with certain aspects of the present disclosure.

FIG. 4A is a block diagram of an example power supply circuit 400, in accordance with certain aspects of the present disclosure. The power supply circuit 400 may generally include a boost converter 410, a delay element 420, a supply reference generator 430, logic 440, and an amplifier 450. The power supply circuit 400 is capable of adaptively adjusting an input current limit ($I_{lim}$) for the boost converter 410. In other words, instead of the input current being limited to a constant maximum value (e.g., $I_{max\_ref}$ as described above for FIG. 3B), the input current may be limited to a value (e.g., $I_{lim}$) based on the input voltage (labeled "$V_{in}$") and the estimated output power (e.g., the average predicted output power). For certain aspects, the input current limit may also be adaptively adjusted based on the frequency content of the input signal to be amplified. Although FIG. 4A includes a boost converter 410, the reader is to understand that certain aspects of the present disclosure may apply to other switched-mode power supplies, such as a buck converter.

The delay element 420 may be implemented by any of various suitable components for adding a delay to a signal, such as one or more buffers, one or more inverters, or a combination thereof. The delay element 420 may be implemented as a separate component (as depicted in FIG. 4A) or as part of another digital component (e.g., the logic 440 or the DSP 120). The delay element 420 may receive an input signal (e.g., a digital input signal) at an input node (labeled "D_in"). For example, the input signal may be a digital audio signal output by a DSP (e.g., the DSP 120 of FIG. 1 or the DSP 202 of FIG. 2). The delay element 420 may be configured to delay the input signal with a delay time to generate a delayed version of the input signal at an output of the delay element. By delaying the input signal, the delay element 420 may provide additional time to allow the logic 440 to effectively implement the look-ahead feature (e.g., a predicted output power for the boost converter) and adaptively adjust an input current limit ($I_{lim}$) for the boost converter 410 based on this predicted output power for the boost converter 410. Adaptively adjusting the input current limit for the boost converter 410 may be performed continuously and may be based on a point in the input signal before the amplifier 450 amplifies that point in the input signal (or in this case, the delayed version thereof).

Although a digital-to-analog converter (DAC) is not shown in FIG. 4A, it is to be understand that there may be a DAC (e.g., DAC 208) between the output of the delay element 420 and the input of the amplifier 450. Such a DAC may be used to convert the delayed version of the digital input signal to an analog signal to be amplified by the amplifier 450. For other aspects, the DAC may be considered as being part of the delay element 420 or part of the amplifier 450.

The supply reference generator 430 may have a first input coupled to the input node D_in, a second input coupled to the output of the delay element 420, and an output coupled to a reference voltage input (labeled "$V_{ref}$") of the boost converter 410. The supply reference generator 430 may be configured to compare the signals at the first and second inputs (e.g., the input signal at D_in and the delayed input signal), and supply a reference voltage $V_{ref}$ to the boost converter 410 based on the comparison. For example, the supply reference generator 430 may be configured to generate the reference voltage $V_{ref}$—at a voltage level that causes the boost converter 410 to produce an output voltage (labeled "$V_{boost\_out}$") at the output of the boost converter 410 to provide sufficient headroom for the amplifier 450 to generate an amplified signal by amplifying the delayed input signal—based on the greater of the voltages at the first and second inputs of the supply reference generator 430.

The boost converter 410 may be similar to the boost converter in the power supply circuit 300 of FIGS. 3A and 3B, but with an input current limit (km) that may be dynamically adjusted by the logic 440. The boost converter 410 may have an output coupled to a power supply input of a load (e.g., the amplifier 450). For certain aspects, the amplifier 450 may be similar to the amplifier 210 in FIGS. 2 and 3A, and may function as (or include) a speaker driver, a head phone amplifier, or another type of amplifier (e.g., unrelated to audio signals). For other aspects, the amplifier 450 may include additional components and implement additional functions, such as digital-to-analog conversion by a DAC (e.g., the DAC 208 of FIG. 2). The amplifier 450 may be configured to amplify the delayed version of the input signal for outputting at an output node (labeled "$V_{out}$") of the power supply circuit 400. In certain aspects, the amplifier 450 may include a speaker driver and the input signal may include an audio signal (e.g., a delayed digital audio signal).

The logic 440 (also referred to as "logic circuitry") may have a first input coupled to the input node D_in and the input of the delay element 420, and an output coupled to a control input of the boost converter 410. The logic 440 may be configured to adaptively adjust the input current limit (km) for the boost converter 410 based on an estimated power for the boost converter 410, and apply the input current limit to the boost converter 410. The estimated power may be an estimated output power or an estimated input power, where the estimated input power equals the estimated output power divided by an efficiency (ii). In certain aspects, the logic 440 may also be configured to determine an averaged predicted output (or input) power for the boost converter 410 as the estimated power. In certain aspects, the estimated power may be determined based on a power level and a frequency content of the input signal to be amplified by the amplifier 450 (or at least the delayed version thereof).

Figure 4B:
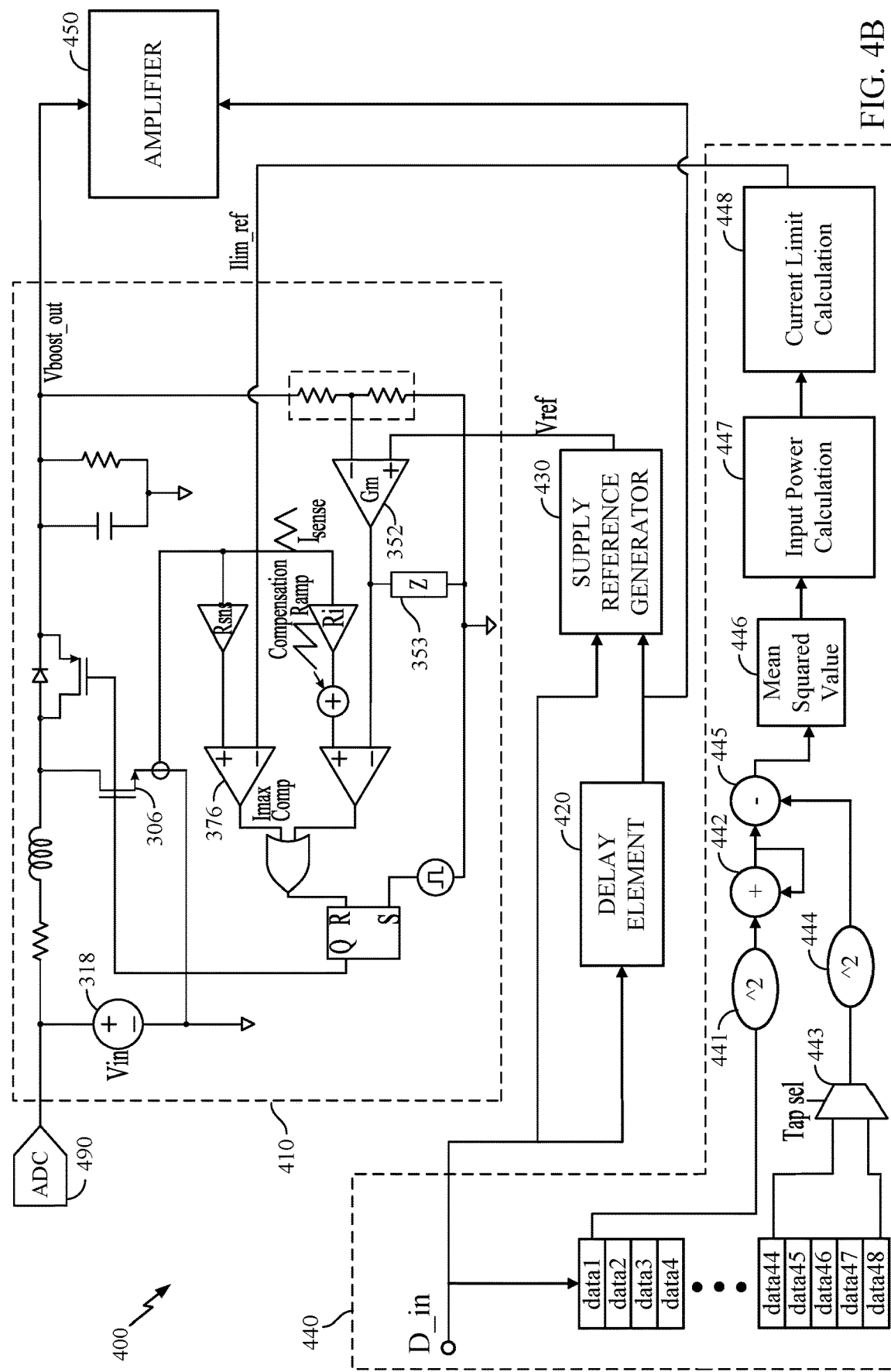
FIG. 4B illustrates an example implementation of the boost converter and logic of FIG. 4A, in accordance with certain aspects of the present disclosure.

FIG. 4B illustrates an example implementation of the boost converter 410 and logic 440 of FIG. 4A, in accordance with certain aspects of the present disclosure.

The boost converter 410 may be similar to the boost converter in the power supply circuit 300 of FIGS. 3A and 3B, but with an input current limit ($I_{lim}$, or practically in this implementation, an input current limit reference voltage labeled "$L_{lim\_ref}$") that may be dynamically adjusted by the logic 440, rather than a constant value. As illustrated, the boost converter 410 may include an amplifier 352 (e.g., a transconductance (Gm) amplifier) with a positive input coupled to the reference voltage $V_{ref}$ generated by the supply reference generator 430. The output of the amplifier 352 may influence the duty cycle of the boost converter 410 (as discussed above with respect to FIG. 3B).

As shown, the boost converter 410 may include a transistor (implementing the switch 306) and a current-sensing circuit having an input coupled to a branch of the boost converter 410 with the transistor. The boost converter 410 may also include a comparator 376 having a first input (e.g., the positive terminal of comparator 376) coupled to an output of the current-sensing circuit, a second input (e.g., the negative terminal of comparator 376) coupled to an output of the logic 440 (e.g., $I_{lim\_ref}$), and an output coupled to a control input of the transistor (e.g., via other logic components, as described with respect to FIG. 3B).

The power supply circuit 400 may also include an analog-to-digital converter (ADC) 490 configured to sample an input voltage ($V_{in}$) of the boost converter 410 and provide this sampled voltage to the logic 440. In certain aspects, the input voltage $V_{in}$ may be equal to a battery voltage (e.g., $V_{bat}$) of a battery (e.g., battery 122) for a device. The logic 440 may be configured to adaptively adjust the input current limit based on the estimated output power for the boost converter 410 and on the input voltage $V_{in}$ (discussed in greater detail below).

The logic 440 may generally include circuitry for calculating the input current limit for the boost converter 410. At a first squaring stage 441, the logic 440 may be configured to square samples (instances) of the digital input signal (e.g., "data1," "data2," etc.). At a summation stage 442, the logic 440 may take the sum of the squared samples.

The logic 440 may include a multiplexer 443 with multiple data inputs coupled to the samples of the digital input signal (which may be referred to as "taps" or "data points") and a control input (labeled "Tap_sel"). The value of the control input may be pre-selected or programmable. The multiplexer 443 may be configured to select one of the input signal samples to output based on the control input Tap_sel. In some cases, Tap_sel may indicate for the multiplexer 443 to select a portion of the input signal samples that are above a threshold frequency (e.g., Tap_sel may indicate a cutoff frequency for filtering out a portion of the input signal, such as a high frequency portion). At a second squaring stage 444, the logic 440 may be configured to square the output of the multiplexer 443. At a subtraction stage 445, the logic 440 may be configured to subtract the squared output of the multiplexer 443 from the sum of the squared input signal samples (e.g., the output of the summation stage 442). Accordingly, the subtraction stage 445 may operate as a filter by filtering out the portion of the input signal samples selected by the multiplexer 443. In some cases (e.g., where a high frequency portion of the input signal samples is filtered out), the subtraction stage 445 may operate as a low pass filter. The output of the subtraction stage 445 may be referred to as a filtered input signal.

The logic 440 may include a stage 446 for determining the mean squared value of the input signal (referred to as "$V_{out\_ref}^2$"). That is, stage 446 may be configured to divide the sum of squared input signal voltages (e.g., the output of the summation stage 442) by the number of input signal samples actually being used. In some cases, the logic 440 may be configured to determine the mean squared value of the filtered input signal (e.g., the output of the subtraction stage 445) as the mean squared value of the input signal.

The logic 440 may further include a stage 447 for calculating the estimated input (or output) power of the power supply circuit 400 based on the mean squared value of the input signal (e.g., the output of stage 446), a gain of the amplifier 450, and a resistance of the load (e.g., a resistance of the speaker 212, which may be added in some cases to a resistance of the output stage of the amplifier 450). Said another way, the stage 447 may be configured to calculate the estimated output power (e.g., the output power for a 50% duty cycle square wave) as $$\text{Power}_{out} = 2 * I^2 * R = 2R * \left(\frac{V_{out\_ref} * \text{Gain}}{R}\right)^2 = \frac{2 * V_{out\_ref}^2 * \text{Gain}^2}{R}$$

where $V_{out\_ref}^2$ is the filtered, mean-squared value of the input signal (e.g., the processed value of the input signal from the input node D_in) output from stage 446, Gain is the gain of the amplifier 450, and R is the impedance of the load (e.g., the output resistance of the amplifier 450 and the speaker resistance).

The efficiency (Eff or η) of the power supply circuit 400 (e.g., including the efficiency of the boost converter 410 and the efficiency of the amplifier 450) may be calculated as $$\textit{Eff} = \frac{\text{Power}_{out}}{\text{Power}_{in}}$$

where $\text{Power}_{in}$ is an estimated input power of the power supply circuit 400 and $\text{Power}_{out}$ is the estimated output power of the power supply circuit 400. In some cases, the efficiency of the power supply circuit 400 may be known. Accordingly, the stage 447 may divide the estimated output power by the efficiency of at least one of the boost converter 410 or the load (e.g., amplifier 450) to generate the estimated input power. In other words, the stage 447 may calculate the estimated input power as $$\text{Power}_{in} = \frac{2 * V_{out\_ref}^2 * \text{Gain}^2}{R * \textit{Eff}}$$

At stage 448, the logic 440 may be configured to determine the input current limit for the boost converter 410 by dividing the estimated input power by the sampled input voltage ($V_{in}$) of the boost converter. Said another way, the logic 440 may be configured to calculate the input current as $$I_{in} = \frac{\text{Power}_{in}}{V_{in}} = \frac{2 * V_{out\_ref}^2 * \text{Gain}^2}{R * \textit{Eff} * V_{in}}$$

and set the input current limit greater than or equal to $I_{in}$. In this manner, the logic 440 may adaptively calculate the input current limit based on the power to be output by the amplifier 450. In some cases, $V_{in}$ may be equal to a battery voltage (e.g., $V_{bat}$).

In some cases, the logic 440 may be further configured to add some margin to the result of dividing the estimated input power $Power_{in}$ by the input voltage $V_{in}$. For example, because the input current limit may be determined based on averaged predicted output power, the margin may include a ripple value to account for inductor current ripple at the converter output.

In certain aspects, the logic 440 may be further configured to hold the input current limit for a hold time before applying the input current limit to the boost converter 410. The hold time may be designed to prevent the input current limit (and the available converter output power) from dropping before a peak in the amplifier input signal arrives. The hold time may be preset or programmable and may be based on the amount of lookahead available (e.g., the delay time provided by the delay element 420).

The samples of the digital input signal for a given time window may be continuously updated, and the logic 440 may continue to operate on the updated samples. In this manner, the logic 440 may continuously determine the averaged predicted output power as the time window is moved sample by sample.

Figure 6:
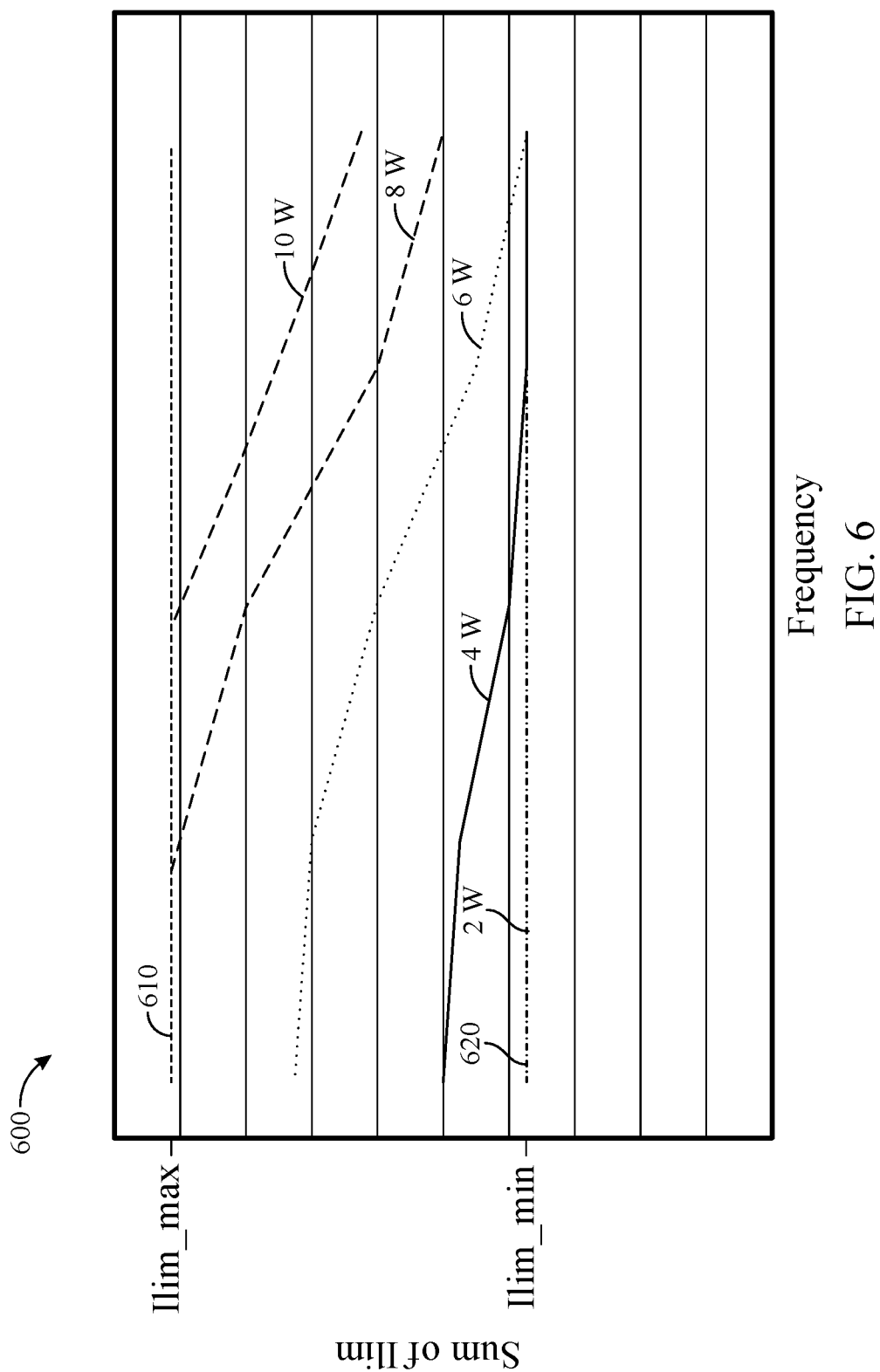
FIG. 6 is a graph showing example input current limits for the boost converter of FIG. 4B versus frequency at various output power levels, in accordance with certain aspects of the present disclosure.

The logic 440 (e.g., stage 448) may be further configured to bound the input current limit, before applying the input current limit to the boost converter 410, to at least one of a maximum input current limit ceiling or a minimum input current limit floor (discussed further with respect to FIG. 6).

As described above, the logic 440 (e.g., stage 448) may convert the input current limit ($I_{lim}$) to a corresponding voltage (e.g., $I_{lim\_ref}$) for use by the comparator 376.

In situations where the input current limit is selected based on an averaged predicted output power, the limited input current may not be sufficient to prevent droop in the output signal at all times. For example, in some cases, the input signal includes relatively high frequencies (e.g., ≥1 kHz). In this case, an output capacitor (e.g., $C_{boost}$ in FIG. 3B) at the output of the boost converter may be able to provide sufficient supplemental current at the output to prevent drooping of the output voltage signal. However, in situations where the input signal includes relatively low frequencies (e.g., <1 kHz, such as around 200 Hz), the output capacitor may not be able to provide sufficient current, which may result in drooping of the output voltage signal.

Accordingly, certain aspects of the present disclosure provide for methods to adjust an input current limit for the boost converter based on the frequency content of the input signal to be amplified by the amplifier, as well as on the estimated power. In these aspects, the input current limit may be based on an average predicted output power when the input signal includes relatively high frequency content, but may be based on an instantaneous peak power when the input signal includes relatively low frequency content.

Figure 5A:
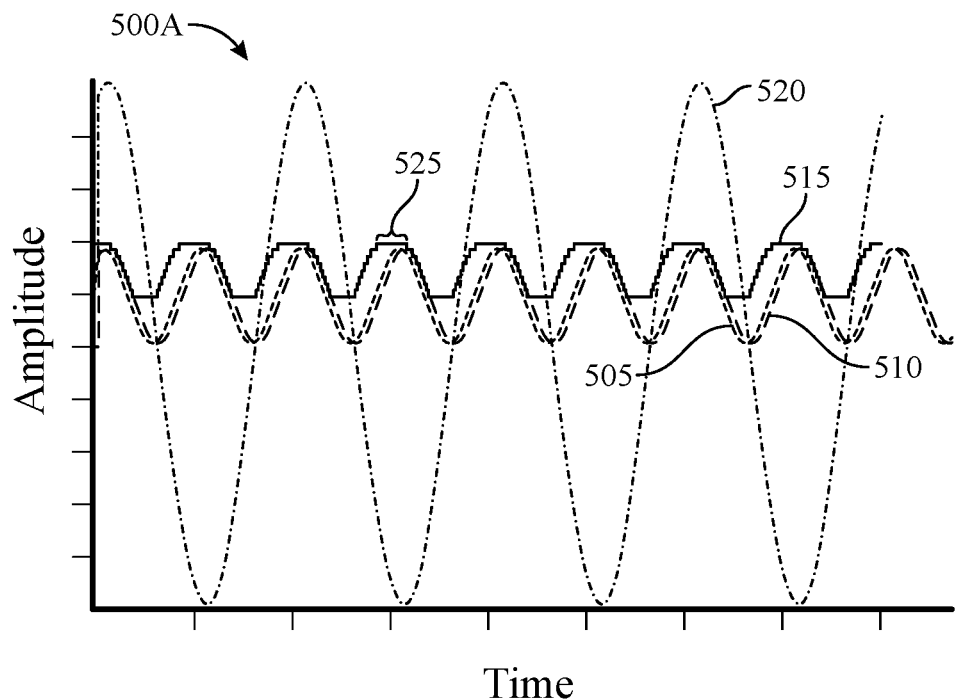
FIGS. 5A and 5B are plots of an input current limit for the boost converter of FIG. 4B over time based on a frequency of an input signal for an amplifier powered by the boost converter, in accordance with certain aspects of the present disclosure.
Figure 5B:
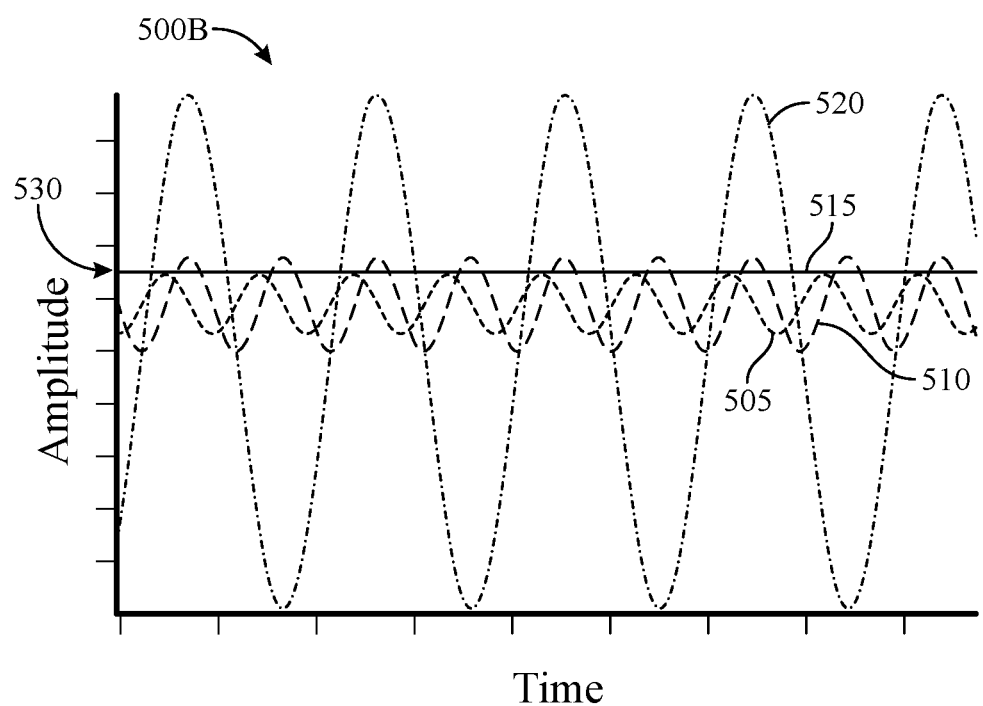

FIGS. 5A and 5B are plots of an input current limit 515 for the boost converter of FIG. 4B over time based on a frequency of an input signal for an amplifier powered by the boost converter, in accordance with certain aspects of the present disclosure. Signal 510 illustrates an example instantaneous input current signal. Signal 505 illustrates an example filtered input current signal, representing a low-pass-filtered version of the instantaneous input current signal 510. Signal 520 illustrates an example voltage signal at the output of the amplifier 450.

Plot 500A in FIG. 5A illustrates a situation in which the input signal includes relatively low frequencies. In this case, the filtered input current signal 505 and the instantaneous input current signal 510 may track each other closely, as shown. Also in this case, the input current limit 515 may be based on an estimated instantaneous peak output power for the boost converter. As shown, the input current limit 515 may lead the instantaneous input current signal 510, such that the peak of the input current limit 515 may be calculated and provided before the instantaneous input current signal 510 reaches a peak value.

In certain aspects, logic (e.g., logic 440) may be configured to hold the input current limit 515 at a value for a hold time (e.g., the hold time 525). The hold time 525 may be based on the delay time before the input current limit 515 is applied to the boost converter (e.g., based on the lookahead time provided by the delay element 420). In some cases, the hold time 525 may be approximately equal to or slightly more than the amount of delay time.

Plot 500B in FIG. 5B illustrates a situation in which the input signal includes relatively high frequencies. In this case, the input current limit 515 may be based on an averaged predicted output power for the boost converter (the calculation for which is described above with respect to FIG. 4B). For example, as shown, the input current limit 515 may have a constant (or at least nearly constant) value 530 based on the averaged predicted output power for the boost converter.

As shown, in some instances, the instantaneous input current signal 510 may exceed the input current limit 515. However, as mentioned above, the output voltage signal 520 may remain sinusoidal (e.g., without drooping) because an output capacitor (e.g., $C_{boost}$ in FIG. 3B) at the output of the boost converter may provide sufficient boost output current to compensate for the difference between the values of the instantaneous input current signal 510 and the input current limit 515 during these instances.

FIG. 6 is a graph 600 showing example input current limits for the boost converter of FIG. 4B versus frequency at various output power levels, in accordance with certain aspects of the present disclosure. Each curve on the graph 600 illustrates example input current limits as a function of frequency for the boost converter delivering different output power levels. For instance, curve 610 may represent the input current limit versus frequency for the boost converter operating with an output power level of 10 W, while curve 620 may represent the input current limit versus frequency for the boost converter operating with an output power level of 2 W. The other curves in between may represent the input current limit versus frequency for the boost converter operating with various output power levels between the power levels represented by curves 610 and 620 (e.g., 8 W, 6 W, and 4 W, from top to bottom of the graph 600).

As shown and described above, the input current limit may vary based on the frequency of the input data signal. For lower frequencies, the input current limit may be based on the instantaneous peak output power, but as the frequencies increase (e.g., above 1 kHz), the input current limit may decrease as the input current limit is based on an averaged predicted output power. As shown, the input current limit may be higher when the input signal includes relatively low frequencies and is lower when the input signal includes relatively high frequencies.

For certain aspects, the input current limit may be bound by an upper limit and/or a lower limit. The graph of FIG. 6 illustrates the input current limits being bound by both an upper limit and a lower limit. For example, the input current limit may be bound to at least one of a maximum input current limit ceiling (e.g., Ilim_max) or a minimum input current limit floor (e.g., Ilim_min). So, while the boost converter operates at higher power levels, logic circuitry (e.g., logic 440, and more particularly stage 448) may determine that the calculated input current limit is greater than Ilim_max and may cap the input current limit at Ilim_max. Similarly, while the boost converter operates at lower power levels (or with higher frequencies), the logic circuitry may determine that the calculated input current limit is less than Ilim_min and may prevent the input current limit from dropping below Ilim_min. This may serve to prevent the boost converter from drawing a current amount that is above a first operating threshold or below a second operating threshold.

Example Operations for Supplying Power

Figure 7:
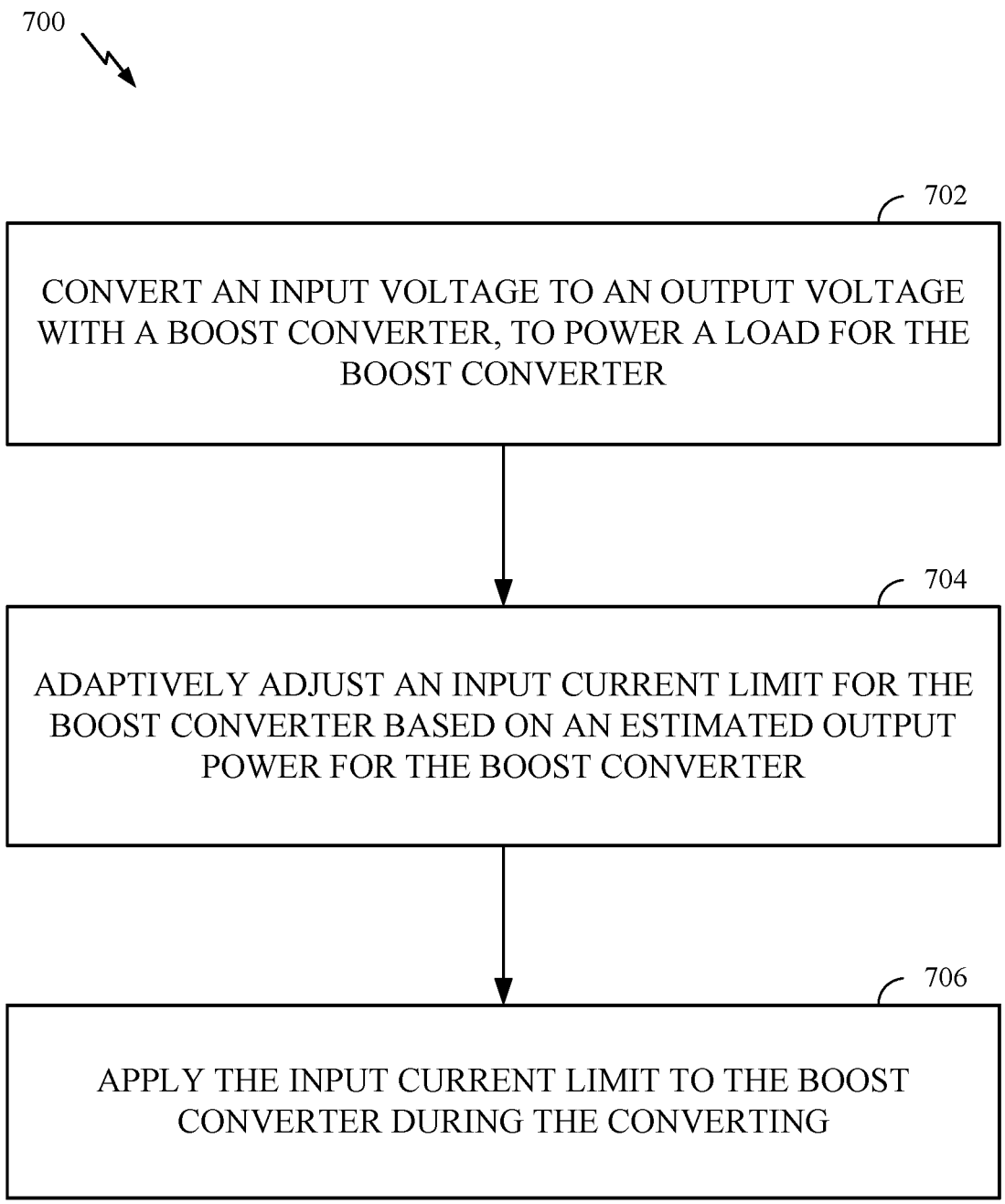
FIG. 7 is a flow diagram of example operations for supplying power, in accordance with certain aspects of the present disclosure.

FIG. 7 is a flow diagram of example operations 700 for supplying power, in accordance with certain aspects of the present disclosure. The operations 700 may be performed by a power supply circuit, such as the power supply circuit 400 of FIGS. 4A and 4B.

The operations 700 may begin, at block 702, with the circuit—and more particularly, for example, a boost converter (e.g., boost converter 410 in FIGS. 4A and 4B)—converting an input voltage (e.g., $V_{in}$) to an output voltage (e.g., $V_{boost\_out}$) to power a load (e.g., $R_{load}$ in FIG. 3B or amplifier 450 in FIGS. 4A and 4B) for the boost converter. At block 704, the circuit (and more particularly, for example, logic, such as the logic 440 in FIGS. 4A and 4B) may adaptively adjust an input current limit for the boost converter based on an estimated output power (e.g., divided by an efficiency, or on an estimated input power) for the boost converter. At block 706, the circuit (and more particularly, in some cases, logic, such as the logic 440 in FIGS. 4A and 4B) may apply the input current limit to the boost converter during the converting.

According to certain aspects, the operations 700 may further involve determining an averaged predicted output power for the boost converter as the estimated output power.

For certain aspects, the operations 700 may further involve sensing the input voltage (e.g., with analog-to-digital converter 490). In this case, the input current limit may be adaptively adjusted based on the estimated output power for the boost converter and the input voltage.

According to certain aspects, the load may include an amplifier (e.g., amplifier 450 in FIGS. 4A and 4B). The estimated output power may be determined based on a power level and a frequency content of an input signal (e.g., based on a digital signal at the input node D_in, such as the analog signal 220) to be amplified by the amplifier. In certain aspects, the amplifier may include a speaker driver, and the input signal may include an audio signal. For certain aspects, the operations 700 may further involve sensing the input voltage (e.g., $V_{in}$) of the boost converter and/or determining a mean squared value of the input signal (e.g., $V_{out\_ref}^2$). In certain aspects, the operations 700 may further involve calculating the estimated output power based on the mean squared value of the input signal, a gain of the amplifier, and a resistance of the load, and dividing the estimated output power by an efficiency of at least one of the boost converter or the load to generate an estimated input power. In certain aspects, the operations 700 may further involve determining the input current limit by dividing the estimated input power by the input voltage. For certain aspects, determining the input current limit may further involve adding a ripple value to a result of dividing the estimated input power by the input voltage. In certain aspects, determining the mean squared value of the input signal (e.g., $V_{out\_ref}^2$) may involve filtering the input signal and determining the mean squared value of the filtered input signal as the mean squared value of the input signal. For certain aspects, the operations 700 may also involve delaying the input signal with a delay time, amplifying the delayed input signal with the amplifier, and holding the input current limit based on the delay time before applying the input current limit to the boost converter.

According to certain aspects, if the input signal comprises relatively high frequencies, the input current limit may be based on an averaged predicted output power for the boost converter, whereas if the input signal comprises relatively low frequencies, the input current limit may be based on an estimated instantaneous peak output power for the boost converter. The input current limit may be higher when the input signal comprises relatively low frequencies and may be lower when the input signal comprises relatively high frequencies.

According to certain aspects, the operations 700 may further involve bounding the input current limit, before applying the input current limit to the boost converter at block 706, to at least one of a maximum input current limit ceiling (e.g., Ilim_max) or a minimum input current limit floor (e.g., Ilim_min).

Example Aspects

In addition to the various aspects described above, specific combinations of aspects are within the scope of the disclosure, some of which are detailed below:

Aspect 1: A method of supplying power, comprising: converting an input voltage to an output voltage with a boost converter, to power a load for the boost converter; adaptively adjusting an input current limit for the boost converter based on an estimated output power for the boost converter; and applying the input current limit to the boost converter during the converting.

Aspect 2: The method of Aspect 1, further comprising determining an averaged predicted output power for the boost converter as the estimated output power.

Aspect 3: The method of Aspect 1 or 2, further comprising sensing the input voltage, wherein the input current limit is adaptively adjusted based on the estimated output power for the boost converter and the input voltage.

Aspect 4: The method of any of the preceding Aspects, wherein the load comprises an amplifier and wherein the estimated output power is determined based on a power level and a frequency content of an input signal to be amplified by the amplifier.

Aspect 5: The method of Aspect 4, wherein: if the input signal comprises relatively high frequencies, the input current limit is based on an averaged predicted output power for the boost converter; and if the input signal comprises relatively low frequencies, the input current limit is based on an estimated instantaneous peak output power for the boost converter.

Aspect 6: The method of Aspect 4 or 5, further comprising: sensing the input voltage of the boost converter; determining a mean squared value of the input signal; calculating the estimated output power based on the mean squared value of the input signal, a gain of the amplifier, and a resistance of the load; dividing the estimated output power by an efficiency of at least one of the boost converter or the load to generate an estimated input power; and determining the input current limit by dividing the estimated input power by the input voltage.

Aspect 7: The method of Aspect 6, wherein determining the input current limit further comprises adding a ripple value to a result of dividing the estimated input power by the input voltage.

Aspect 8: The method of Aspect 6 or 7, wherein determining the mean squared value comprises filtering the input signal and determining the mean squared value of the filtered input signal as the mean squared value of the input signal.

Aspect 9: The method of any of Aspects 6-8, further comprising: delaying the input signal with a delay time; amplifying the delayed input signal with the amplifier; and holding the input current limit based on the delay time before applying the input current limit to the boost converter.

Aspect 10: The method of any of Aspects 4-9, wherein the amplifier comprises a speaker driver and wherein the input signal comprises an audio signal.

Aspect 11: The method of any of Aspects 4-10, wherein the input current limit is higher when the input signal comprises relatively low frequencies and is lower when the input signal comprises relatively high frequencies.

Aspect 12: The method of any of the preceding Aspects, further comprising bounding the input current limit, before applying the input current limit to the boost converter, to at least one of a maximum input current limit ceiling or a minimum input current limit floor.

Aspect 13: A circuit for supplying power to a load, comprising: a boost converter having an output coupled to the load; and logic configured to: adaptively adjust an input current limit for the boost converter based on an estimated output power for the boost converter; and apply the input current limit to the boost converter.

Aspect 14: The circuit of Aspect 13, wherein the logic is further configured to determine an averaged predicted output power for the boost converter as the estimated output power.

Aspect 15: The circuit of Aspect 13 or 14, wherein the boost converter comprises: a transistor; a current-sensing circuit having an input coupled to a branch of the boost converter with the transistor; and a comparator having a first input coupled to an output of the current-sensing circuit, having a second input coupled to an output of the logic configured to provide the input current limit, and having an output coupled to a control input of the transistor.

Aspect 16: The circuit of any of Aspects 13-15, further comprising an analog-to-digital converter configured to sample an input voltage of the boost converter, wherein the logic is configured to adaptively adjust the input current limit based on the estimated output power for the boost converter and the input voltage.

Aspect 17: The circuit of any of Aspects 13-16, wherein the load comprises an amplifier configured to amplify an input signal and wherein the estimated output power is determined based on a power level and a frequency content of the input signal to be amplified by the amplifier.

Aspect 18: The circuit of Aspect 17, wherein: if the input signal comprises relatively high frequencies, the input current limit is based on an averaged predicted output power for the boost converter; and if the input signal comprises relatively low frequencies, the input current limit is based on an estimated instantaneous peak output power for the boost converter.

Aspect 19: The circuit of Aspect 17 or 18, further comprising an analog-to-digital converter configured to sample an input voltage of the boost converter, wherein to adaptively adjust the input current limit, the logic is configured to: determine a mean squared value of the input signal; calculate the estimated output power based on the mean squared value of the input signal, a gain of the amplifier, and a resistance of the load; divide the estimated output power by an efficiency of at least one of the boost converter or the load to generate an estimated input power; and determine the input current limit by dividing the estimated input power by the sampled input voltage.

Aspect 20: The circuit of Aspect 19, wherein to determine the input current limit, the logic is further configured to add a ripple value to a result of dividing the estimated input power by the input voltage.

Aspect 21: The circuit of Aspect 19 or 20, wherein to determine the mean squared value, the logic is configured to filter the input signal and to determine the mean squared value of the filtered input signal as the mean squared value of the input signal.

Aspect 22: The circuit of any of Aspects 19-21, further comprising a delay element configured to delay the input signal with a delay time, wherein the amplifier is configured to amplify the delayed input signal and wherein the logic is further configured to hold the input current limit based on the delay time before applying the input current limit to the boost converter.

Aspect 23: The circuit of any of Aspects 17-22, wherein the amplifier comprises a speaker driver and wherein the input signal comprises an audio signal.

Aspect 24: The circuit of any of Aspects 17-23, wherein the input current limit is higher when the input signal comprises relatively low frequencies and is lower when the input signal comprises relatively high frequencies.

Aspect 25: The circuit of any of Aspects 13-24, wherein the logic is further configured to bound the input current limit, before applying the input current limit to the boost converter, to at least one of a maximum input current limit ceiling or a minimum input current limit floor.

Aspect 26: An apparatus for supplying power, comprising: means for converting an input voltage to an output voltage, to power a load for the means for converting, wherein the output voltage is greater than the input voltage; means for adaptively adjusting an input current limit for the means for converting, based on an estimated output power for the means for converting; and means for applying the input current limit to the means for converting.

Aspect 27: The apparatus of Aspect 26, further comprising means for determining an averaged predicted output power for the means for converting as the estimated output power.

Aspect 28: The apparatus of Aspect 26 or 27, further comprising means for sensing the input voltage, wherein the means for adaptively adjusting is configured to adaptively adjust the input current limit based on the estimated output power for the means for converting and the input voltage.

Aspect 29: The apparatus of any of Aspects 26-28, wherein: the load comprises means for amplifying; the estimated output power is determined based on a power level and a frequency content of an input signal to be amplified by the means for amplifying; if the input signal comprises relatively high frequencies, the input current limit is based on an averaged predicted output power for the means for converting; and if the input signal comprises relatively low frequencies, the input current limit is based on an estimated instantaneous peak output power for the means for converting.

Aspect 30: The apparatus of Aspect 29, further comprising means for sensing the input voltage, wherein the means for adaptively adjusting comprises: means for filtering the input signal; means for determining a mean squared value of the filtered input signal; means for calculating the estimated output power based on the mean squared value of the filtered input signal, a gain of the means for amplifying, and a resistance of the load; means for dividing the estimated output power by an efficiency of at least one of the means for converting or the load, to generate an estimated input power; means for dividing the estimated input power by the input voltage; and means for adding a ripple value to a result of dividing the estimated input power by the input voltage, to generate the input current limit.

Additional Considerations

Certain aspects of the present disclosure provide a boost converter circuit with dynamic input current limit control. The dynamic input current limit control works, for example, by determining an input current limit for a boost converter before input signal peaks occur. Accordingly, by dynamically adjusting the input current limit, power loss may be reduced, thereby improving the efficiency of the boost converter. For cases in which the input signal (e.g., of the audio amplifier) includes relatively low frequencies, the input current limit may be based on an estimated instantaneous peak output power for the boost converter. In this case, the input current limit may be held until the signal peak occurs (e.g., so that the speaker driver signal remains clean). For cases in which the input signal includes relatively high frequencies, the input current limit may be based on an averaged predicted output power for the boost converter. In this case, when the signal peak occurs, although the battery current is limited, the speaker driver signal may most likely still be clean because the boost capacitor should be able to provide the rest of the charge.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for converting an input voltage to an output voltage may include a voltage regulator, such as the boost converter in the power supply circuit 300 shown in FIGS. 3A and 3B or the boost converter 410 portrayed in FIGS. 4A and 4B. Means for adaptively adjusting an input current limit may include logic, such as the logic 440 depicted in FIGS. 4A and 4B. Means for applying the input current limit may include logic, such as the comparator 376, the gate 377, and the flip-flop 360 shown in FIGS. 3B and 4B. Means for amplifying may include an amplifier, such as the amplifier 210 shown in FIG. 2 or the amplifier 450 depicted in FIGS. 4A and 4B. Means for delaying may include a delay element, such as the delay element 420 as illustrated in FIGS. 4A and 4B.

Means for determining an averaged predicted output power may include logic, such as the logic 440 depicted in FIGS. 4A and 4B. Means for sensing the input voltage may include a voltage-sensing circuit, such as the analog-to-digital converter 490, which may be preceded by a buffer (not shown). Means for filtering the input signal may include a digital filter (implemented in logic), such as the logic 440 as implemented by the multiplexer 443 and the subtraction stage 445. Means for determining a mean squared value of the filtered input signal may include logic, such as the logic 440 with the stage 446. Means for calculating the estimated output power may include logic, such as the logic 440 with the stage 447. Means for dividing may include logic, such as the logic 440 with the stages 447 and 448. Means for adding may include logic, such as the logic 440 at the stage 448.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A method of supplying power, comprising:
   converting an input voltage to an output voltage with a boost converter, to power a load for the boost converter;
   adaptively adjusting an input current limit for the boost converter based on an estimated output power for the boost converter; and
   applying the input current limit to the boost converter during the converting, wherein:
   the load comprises an amplifier;
   the estimated output power is determined based on a power level and a frequency content of an input signal to be amplified by the amplifier;
   if the input signal comprises relatively high frequencies, the input current limit is based on an averaged predicted output power for the boost converter; and
   if the input signal comprises relatively low frequencies, the input current limit is based on an estimated instantaneous peak output power for the boost converter.

2. The method of claim 1, further comprising determining an averaged predicted output power for the boost converter as the estimated output power.

3. The method of claim 1, further comprising sensing the input voltage, wherein the input current limit is adaptively adjusted based on the estimated output power for the boost converter and the input voltage.

4. The method of claim 1, further comprising:
sensing the input voltage of the boost converter;
determining a mean squared value of the input signal;
calculating the estimated output power based on the mean squared value of the input signal, a gain of the amplifier, and a resistance of the load;
dividing the estimated output power by an efficiency of at least one of the boost converter or the load to generate an estimated input power; and
determining the input current limit by dividing the estimated input power by the input voltage.

5. The method of claim 4, wherein determining the input current limit further comprises adding a ripple value to a result of dividing the estimated input power by the input voltage.

6. The method of claim 4, wherein determining the mean squared value comprises:
filtering the input signal; and
determining the mean squared value of the filtered input signal as the mean squared value of the input signal.

7. The method of claim 4, further comprising:
delaying the input signal with a delay time;
amplifying the delayed input signal with the amplifier; and
holding the input current limit based on the delay time before applying the input current limit to the boost converter.

8. The method of claim 1, wherein the amplifier comprises a speaker driver and wherein the input signal comprises an audio signal.

9. The method of claim 1, wherein the input current limit is higher when the input signal comprises relatively low frequencies and is lower when the input signal comprises relatively high frequencies.

10. The method of claim 1, further comprising bounding the input current limit, before applying the input current limit to the boost converter, to at least one of a maximum input current limit ceiling or a minimum input current limit floor.

11. A circuit for supplying power to a load, comprising:
a boost converter having an output coupled to the load; and
logic configured to:
adaptively adjust an input current limit for the boost converter based on an estimated output power for the boost converter; and
apply the input current limit to the boost converter, wherein the boost converter comprises:
a transistor;
a current-sensing circuit having an input coupled to a branch of the boost converter with the transistor; and
a comparator having a first input coupled to an output of the current-sensing circuit, having a second input coupled to an output of the logic configured to provide the input current limit, and having an output coupled to a control input of the transistor.

12. The circuit of claim 11, wherein the logic is further configured to determine an averaged predicted output power for the boost converter as the estimated output power.

13. The circuit of claim 11, further comprising an analog-to-digital converter configured to sample an input voltage of the boost converter, wherein the logic is configured to adaptively adjust the input current limit based on the estimated output power for the boost converter and the input voltage.

14. The circuit of claim 11, wherein the load comprises an amplifier configured to amplify an input signal and wherein the estimated output power is determined based on a power level and a frequency content of the input signal to be amplified by the amplifier.

15. The circuit of claim 14, wherein:
if the input signal comprises relatively high frequencies, the input current limit is based on an averaged predicted output power for the boost converter; and
if the input signal comprises relatively low frequencies, the input current limit is based on an estimated instantaneous peak output power for the boost converter.

16. The circuit of claim 14, further comprising an analog-to-digital converter configured to sample an input voltage of the boost converter, wherein to adaptively adjust the input current limit, the logic is configured to:
determine a mean squared value of the input signal;
calculate the estimated output power based on the mean squared value of the input signal, a gain of the amplifier, and a resistance of the load;
divide the estimated output power by an efficiency of at least one of the boost converter or the load to generate an estimated input power; and
determine the input current limit by dividing the estimated input power by the sampled input voltage.

17. The circuit of claim 16, wherein to determine the input current limit, the logic is further configured to add a ripple value to a result of dividing the estimated input power by the input voltage.

18. The circuit of claim 16, wherein to determine the mean squared value, the logic is configured to:
filter the input signal; and
determine the mean squared value of the filtered input signal as the mean squared value of the input signal.

19. The circuit of claim 16, further comprising a delay element configured to delay the input signal with a delay time, wherein the amplifier is configured to amplify the delayed input signal and wherein the logic is further configured to hold the input current limit based on the delay time before applying the input current limit to the boost converter.

20. The circuit of claim 14, wherein the amplifier comprises a speaker driver and wherein the input signal comprises an audio signal.

21. The circuit of claim 14, wherein the input current limit is higher when the input signal comprises relatively low frequencies and is lower when the input signal comprises relatively high frequencies.

22. The circuit of claim 11, wherein the logic is further configured to bound the input current limit, before applying the input current limit to the boost converter, to at least one of a maximum input current limit ceiling or a minimum input current limit floor.

23. An apparatus for supplying power, comprising:
means for converting an input voltage to an output voltage, to power a load for the means for converting, wherein the output voltage is greater than the input voltage;
means for adaptively adjusting an input current limit for the means for converting, based on an estimated output power for the means for converting; and
means for applying the input current limit to the means for converting, wherein:
the load comprises means for amplifying, the estimated output power being determined based on a power level and a frequency content of an input signal to be amplified by the means for amplifying;

if the input signal comprises relatively high frequencies, the input current limit is based on an averaged predicted output power for the means for converting; and if the input signal comprises relatively low frequencies, the input current limit is based on an estimated instantaneous peak output power for the means for converting.

24. The apparatus of claim 23, further comprising means for determining an averaged predicted output power for the means for converting as the estimated output power.

25. The apparatus of claim 23, further comprising means for sensing the input voltage, wherein the means for adaptively adjusting is configured to adaptively adjust the input current limit based on the estimated output power for the means for converting and the input voltage.

26. The apparatus of claim 23, further comprising means for sensing the input voltage, wherein the means for adaptively adjusting comprises:

means for filtering the input signal;

means for determining a mean squared value of the filtered input signal;

means for calculating the estimated output power based on the mean squared value of the filtered input signal, a gain of the means for amplifying, and a resistance of the load;

means for dividing the estimated output power by an efficiency of at least one of the means for converting or the load, to generate an estimated input power;

means for dividing the estimated input power by the input voltage; and means for adding a ripple value to a result of dividing the estimated input power by the input voltage, to generate the input current limit.

* * * * *